(12) United States Patent
Li et al.

(10) Patent No.: US 10,608,653 B2
(45) Date of Patent: Mar. 31, 2020

(54) DIGITAL-TO-ANALOG CONVERSION CIRCUIT

(71) Applicant: HUAWEI TECHNOLOGIES CO., LTD., Shenzhen (CN)

(72) Inventors: Ding Li, Shenzhen (CN); Shuai Du, Chengdu (CN); Hongpei Wang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/255,663

(22) Filed: Jan. 23, 2019

(65) Prior Publication Data

US 2019/0229739 A1 Jul. 25, 2019

Related U.S. Application Data

(63) Continuation of application No. 15/857,651, filed on Dec. 29, 2017, now Pat. No. 10,224,947.

(30) Foreign Application Priority Data

Dec. 30, 2016 (CN) .......................... 2016 1 1264816

(51) Int. Cl.
*H03M 1/00* (2006.01)
*H03M 1/06* (2006.01)
(Continued)

(52) U.S. Cl.
CPC ........... *H03M 1/068* (2013.01); *H03M 1/406* (2013.01); *H03M 1/742* (2013.01); *H03M 1/00* (2013.01);
(Continued)

(58) Field of Classification Search
CPC ............ H03M 1/66; H03M 1/00; H03M 1/80; H03M 1/802
(Continued)

(56) References Cited

U.S. PATENT DOCUMENTS 6,967,609 B1 * 11/2005 Bicakci ............ H03K 17/04106
341/144
7,924,197 B1 4/2011 Liu et al.
(Continued)

FOREIGN PATENT DOCUMENTS

| CN | 102055478 A | 5/2011 |
| CN | 103155416 A | 6/2013 |
| TW | 200511734 A | 3/2005 |

*Primary Examiner* — Joseph J Lauture
(74) *Attorney, Agent, or Firm* — Kilpatrick Townsend & Stockton LLP

(57) ABSTRACT

Embodiments of the present invention provide a digital-to-analog conversion circuit, where the digital-to-analog conversion circuit includes a signal amplitude detector and a digital-to-analog converter. When the signal amplitude detector detects a low signal amplitude, a first current module in the digital-to-analog converter operates normally and a second current module in the digital-to-analog converter stops operating. In addition, when stopping operating, the second current module is in a state of a third bias voltage and a fourth bias voltage that are generated by a second bias circuit. When the amplitude detector detects a high signal amplitude subsequently, the second current module resumes normal operation. After operating normally, the second current module switches back to a first bias voltage and a second bias voltage that are generated by a first bias circuit. This reduces a nonlinearity problem caused before a second current module resumes normal operation.

10 Claims, 6 Drawing Sheets

(51) Int. Cl.
　　　*H03M 1/74*　　　(2006.01)
　　　*H03M 1/40*　　　(2006.01)
　　　H03M 1/78　　　(2006.01)
　　　H03M 1/10　　　(2006.01)
　　　H03M 1/66　　　(2006.01)
　　　H03M 1/80　　　(2006.01)

(52) U.S. Cl.
　　　CPC ............ *H03M 1/1009* (2013.01); *H03M 1/66* (2013.01); *H03M 1/745* (2013.01); *H03M 1/785* (2013.01); *H03M 1/80* (2013.01)

(58) Field of Classification Search
　　　USPC .................. 341/144, 145, 153, 172; 345/690
　　　See application file for complete search history.

(56) References Cited

U.S. PATENT DOCUMENTS

| | | |
|---|---|---|
| 2005/0052298 A1 | 3/2005 | Moon |
| 2009/0045993 A1 | 2/2009 | Tokumaru et al. |
| 2011/0074613 A1 | 3/2011 | Newman |
| 2011/0102225 A1 | 5/2011 | Liu et al. |
| 2012/0092199 A1 | 4/2012 | Corsi et al. |
| 2014/0152479 A1 | 6/2014 | Felder |
| 2014/0266824 A1 | 9/2014 | Lowney et al. |

* cited by examiner

DIGITAL-TO-ANALOG CONVERSION CIRCUIT

CROSS-REFERENCE TO RELATED APPLICATION

This application is a continuation of U.S. patent application Ser. No. 15/857,651, filed on Dec. 29, 2017, which claims priority to Chinese Patent Application No. 201611264816.0, filed on Dec. 30, 2016, All of the aforementioned patent applications are hereby incorporated by reference in their entireties.

TECHNICAL FIELD

Embodiments of the present invention relate to the field of electronic technologies, and in particular, to a digital-to-analog converter.

BACKGROUND

With rapid development of the communications market, a module between digital and analog in an integrated circuit becomes increasingly important. In applications in the video and wireless fields, a digital-to-analog converter (DAC) needs to have a high speed and high precision. A current steering DAC is widely applied to integrated circuits, and a current steering structure has advantages of a high speed, high precision, and ease of complementary metal-oxide-semiconductor (CMOS) current integration.

FIG. 1 is a structural diagram of a DAC having a three-state structure provided in the prior art. The structure of the DAC mainly includes two parts: N current modules (ICELL1, ICELL2, . . . , ICELLN) and a current-to-voltage conversion module. The current module is configured to convert a digital signal into an analog current. Each current module includes one logical conversion unit and one current unit. The logical conversion unit is configured to convert an input digital signal DIN into a switch control signal that is used to control the current unit to operate normally or stop operating. The current unit controls, based on the received switch control signal, a signal switch included in the current unit to be opened or closed, so as to operate normally or stop operating. Each current module outputs two differential current signals to the current-to-voltage conversion module. The current-to-voltage conversion module is configured to convert an analog current signal that is output by the current module into an analog voltage signal.

The current module ICELL1 is used as an example in FIG. 1. The ICELL1 includes two current sources Ip and In that are used to provide a current respectively to an upper MOS transistor and a lower MOS transistor. AVADD represents a source voltage. AGND represents grounding. A bias voltage VBP is used to provide a voltage to a gate of the upper MOS transistor, and a bias voltage VBN is used to provide a voltage to a gate of the lower MOS transistor. In addition, the current module includes three parallel switch branch circuits. One switch branch circuit includes two SZ signal switches connected in series, and the other two switch branch circuits each include an SN signal switch and an SP signal switch connected in series. A drain of the upper MOS transistor and a drain of the lower MOS transistor are separately connected to the three parallel switch branch circuits, and separately obtain two differential current signals from the foregoing two branch circuits constituted by the SN signal switch and the SP signal switch connected in series and provide the two differential current signals to an operational amplifier (OPA) of the current-to-voltage conversion module. In addition to the OPA, the current-to-voltage conversion module further includes two resistors R1 and R2. The R1 is connected between a positive input end and a negative output end of the OPA, and the R2 is connected between a negative input end and a positive output end of the OPA. The current-to-voltage conversion module outputs two analog voltage signals OUTP and OUTN by using the OPA.

For a design of the DAC having such a structure, to reduce a jitter of a current unit in the DAC and reduce nonlinearity of the DAC, not all switches of all current units in the DAC are opened at the same time, that is, not all of the current units are in a non-operating state. Therefore, regardless of a value of a signal amplitude, each current unit in the DAC has a current, leading to power consumption. Consequently, power consumption of the entire DAC is relatively high.

SUMMARY

Embodiments of the present invention provide a digital-to-analog conversion circuit, to adjust power consumption of the digital-to-analog conversion circuit based on a signal amplitude on the premise that a jitter problem of a current module in the digital-to-analog conversion circuit is resolved.

According to a first aspect, an embodiment of the present invention provides a digital-to-analog conversion circuit, where the digital-to-analog conversion circuit includes a signal amplitude detector and a digital-to-analog converter, and the digital-to-analog converter includes a signal controller, a first current module, and a second current module;

the signal amplitude detector is configured to detect, at a first time T1, that a signal amplitude of a digital signal is a low signal amplitude, and send, to the signal controller, first indication information indicating the low signal amplitude, and is further configured to detect, at a second time T2 after the first time T1, that a signal amplitude of the digital signal is a high signal amplitude, and send, to the signal controller, second indication information indicating the high signal amplitude;

the signal controller is configured to receive the first indication information sent by the signal amplitude detector, and generate, according to the first indication information, a first control signal provided to the first current module and generate a second control signal provided to the second current module, where the first control signal is used to control a current module that receives the first control signal to operate normally, and the second control signal is used to control a current module that receives the second control signal to stop operating;

the first current module is configured to operate normally according to the first control signal, and set a bias voltage of a gate of a first MOS transistor and a bias voltage of a gate of a second MOS transistor in the first current module respectively to a first bias voltage VBP1 and a second bias voltage VBN1, where a source of the first MOS transistor is connected to a first analog power supply VADD, a source of the second MOS transistor is grounded, a drain of the first MOS transistor and a drain of the second MOS transistor are coupled, and the first bias voltage VBP1 and the second bias voltage VBN1 are generated by a first bias circuit;

the second current module is configured to stop operating according to the second control signal, and switch a bias voltage of a gate of a third MOS transistor in the second current module from the first bias voltage VBP1 to a third bias voltage VBP2 and switch a bias voltage of a gate of a fourth MOS transistor in the second current module from the second bias voltage VBN1 to a fourth bias voltage VBN2, where a source of the third MOS transistor is connected to a second analog power supply VADD, a source of the fourth MOS transistor is grounded, a drain of the third MOS transistor and a drain of the fourth MOS transistor are coupled, and the third bias voltage VBP2 and the fourth bias voltage VBN2 are generated by a second bias circuit;

the signal controller is further configured to receive the second indication information sent by the signal amplitude detector, and generate, according to the second indication information, the first control signal provided to the second current module; and the second current module is configured to resume normal operation according to the received first control signal, and switch, after operating normally, the bias voltage of the gate of the third MOS transistor from the third bias voltage VBP2 to the first bias voltage VBP1 and switch the bias voltage of the gate of the fourth MOS transistor from the fourth bias voltage VBN2 to the second bias voltage VBN1.

That a current module operates normally means that a current in the current module is in a stable state. When the current is increasing or decreasing, the current module cannot operate normally. When operating normally, the current module consumes power. That a current module stops operating means that all signal switches in the current module are opened. As a result, no current exists in the current module, and no power consumption is caused.

It can be learned from the above that the signal amplitude detector is introduced into the digital-to-analog conversion circuit. When the signal amplitude detector detects the low signal amplitude, the first current module operates normally and the second current module stops operating, and therefore power consumption of the digital-to-analog converter is reduced at the low signal amplitude. In addition, when stopping operating, the second current module is in a state of the third bias voltage and the fourth bias voltage that are generated by the second bias circuit, and when operating normally, the first current module is in a state of the first bias voltage and the second bias voltage that are generated by the first bias circuit. When the amplitude detector detects the high signal amplitude subsequently, the second current module needs to resume normal operation. At this time, the second current module is still in the state of the third bias voltage and the fourth bias voltage that are generated by the second bias circuit, and the first current module is in the state of the first bias voltage and the second bias voltage that are generated by the first bias circuit. Therefore, before the second current module resumes normal operation, a jitter generated in the second current module does not affect the first current module. After the second current module operates normally, the second current module switches back to the first bias voltage and the second bias voltage that are generated by the first bias circuit. This further reduces a nonlinearity problem caused in a process in which the second current module resumes normal operation.

With reference to the first aspect, in a first implementation of the first aspect, the signal amplitude detector includes:

a delay module, configured to: receive the digital signal, delay the digital signal for N clock cycles, provide the digital signal that is delayed for the N clock cycles to the signal controller, where N is a positive integer greater than or equal to 1, and send the delayed digital signal to a signal amplitude determining circuit after each delay of one clock cycle, where the signal amplitude determining circuit is configured to: determine a maximum signal amplitude value in amplitude values of N delayed digital signals obtained from the delay module, determine, by comparing the maximum signal amplitude value with a preset threshold, that the signal amplitude of the digital signal at the time T1 is the low signal amplitude and the signal amplitude of the digital signal at the time T2 is the high signal amplitude, and send the first indication information and the second indication information to the signal controller.

With reference to the first implementation of the first aspect, in a second possible implementation of the first aspect, the signal amplitude determining circuit includes:

a maximum signal amplitude determining circuit, configured to obtain the N delayed digital signals from the delay module, and determine the maximum signal amplitude value in the amplitude values of the N delayed digital signals;

a determining circuit, configured to: compare the maximum signal amplitude value with the preset threshold, and determine that the signal amplitude of the digital signal is the high signal amplitude when the maximum signal amplitude value is greater than the threshold, or determine that the signal amplitude of the digital signal is the low signal amplitude when the maximum signal amplitude value is not greater than the threshold; and a transmitter circuit, configured to send the first indication information and the second indication information to the signal controller after the determining circuit determines the high signal amplitude and the low signal amplitude.

With reference to the first implementation of the first aspect, in a third possible implementation of the first aspect, the signal amplitude determining circuit includes:

a maximum signal amplitude determining circuit, configured to obtain the N delayed digital signals from the delay module, and determine the maximum signal amplitude value in the amplitude values of the N delayed digital signals;

a determining circuit, configured to: compare the maximum signal amplitude value with the preset threshold, and determine that the signal amplitude of the digital signal is the high signal amplitude when the maximum signal amplitude value is greater than the threshold, or determine that the signal amplitude of the digital signal is the low signal amplitude when the maximum signal amplitude value is not greater than the threshold; and a transmitter circuit, configured to send the first indication information to the signal controller after the determining circuit determines the high signal amplitude, and send the second indication information to the signal controller after a delay of a preset time period after the determining circuit determines the low signal amplitude.

A difference between the third possible implementation and the second possible implementation is that: When the low signal amplitude is determined, in the second implementation, the transmitter circuit directly sends the low signal amplitude to the digital-to-analog converter; however, in the third implementation, the transmitter circuit sends the low signal amplitude to the digital-to-analog converter after a delay of the preset time period, and still sends the high signal amplitude to the digital-to-analog converter in the preset time period.

With reference to the first or the second or the third implementation of the first aspect, in a fourth possible implementation of the first aspect, the delay module includes N flip-flops, and each flip-flop is configured to execute a delay of one clock cycle.

With reference to the first or the second or the third or the fourth implementation of the first aspect, in a fifth possible implementation of the first aspect, the second current module includes a logical conversion unit and a current unit, the current unit includes the third MOS transistor, the fourth MOS transistor, and three parallel switch branch circuits, the drain of the third MOS transistor and the drain of the fourth MOS transistor are coupled by using the three parallel switch branch circuits, the three parallel switch branch circuits include a first switch branch circuit formed by a first SN signal switch and a first SP signal switch connected in series, a second switch branch circuit formed by a second SN signal switch and a second SP signal switch connected in series, and a third switch branch circuit including two SZ signal switches connected in series;

the logical conversion unit is configured to receive the first control signal, and generate, based on the first control signal, a switch control signal provided to the current unit, where the switch control signal is used to control the two SZ signal switches connected in series in the third switch branch circuit in the current unit to be in a closed state and the signal switches in the other two switch branch circuits to be in an open state; and correspondingly, the current unit is configured to: control, according to the switch control signal, the two SZ signal switches connected in series in the third switch branch circuit in the current unit to be in the closed state and the signal switches in the other two switch branch circuits to be in the open state, and switch, after the current unit resumes normal operation, the bias voltage of the gate of the third MOS transistor from the third bias voltage VBP2 to the first bias voltage VBP1 and switch the bias voltage of the gate of the fourth MOS transistor from the fourth bias voltage VBN2 to the second bias voltage VBN1.

With reference to the fifth implementation of the first aspect, in a sixth possible implementation of the first aspect, the gate of the third MOS transistor is coupled to the first bias voltage or the third bias voltage by using a first voltage switch, and the gate of the fourth MOS transistor is coupled to the second bias voltage or the fourth bias voltage by using a second voltage switch; and a first node between the drain of the third MOS transistor and the three parallel switch branch circuits is connected to a first parasitic capacitor, and a second node between the drain of the fourth MOS transistor and the three parallel switch branch circuits is connected to a second parasitic capacitor.

With reference to the sixth implementation of the first aspect, in a seventh possible implementation of the first aspect, the current unit is further configured to:

control, according to the switch control signal, the two SZ signal switches connected in series in the third switch branch circuit in the current unit to be closed and a signal switch in another branch circuit to be opened, switch, after establishment of a voltage between the first node and the second node is completed, the bias voltage of the gate of the third MOS transistor from the third bias voltage VBP2 to the first bias voltage VBP1 by using the first voltage switch, and switch the bias voltage of the gate of the fourth MOS transistor from the fourth bias voltage VBN2 to the second bias voltage VBN1 by using the second voltage switch.

With reference to the sixth or the seventh implementation of the first aspect, in an eighth possible implementation of the first aspect, the digital-to-analog conversion circuit further includes a current-to-voltage conversion module, and the first switch branch circuit and the third switch branch circuit are separately connected to the current-to-voltage conversion module; and a first current Ioutp is output between the first SN signal switch and the first SP signal switch in the first switch branch circuit to the current-to-voltage conversion module, and a second current Ioutn is output between the second SN signal switch and the second SP signal switch in the second switch branch circuit to the current-to-voltage conversion module.

With reference to any one of the first aspect or the foregoing implementations of the first aspect, in a ninth possible implementation of the first aspect, a voltage value of the first bias voltage VBP1 is the same as that of the third bias voltage VBP2, and a voltage value of the second bias voltage VBN1 is the same as that of the fourth bias voltage VBN2.

With reference to any one of the first aspect or the foregoing implementations of the first aspect, in a tenth possible implementation of the first aspect, the signal controller is configured to send the generated first control signal to the first current module when receiving the second indication information; and correspondingly, the first current module is configured to continue to operate normally according to the first control signal, and maintain the bias voltage of the gate of the first MOS transistor in the first current module and the bias voltage of the gate of the second MOS transistor in the first current module to be respectively the first bias voltage VBP1 and the second bias voltage VBN1.

According to a second aspect, an embodiment of the present invention provides a method for controlling a bias voltage in a current module, where the method includes:

detecting, by a signal amplitude detector at a first time T1, that a signal amplitude of a digital signal is a low signal amplitude;

generating, by a signal controller according to the low signal amplitude, a first control signal provided to a first current module and generating a second control signal provided to a second current module, where the first control signal is used to control a current module that receives the first control signal to operate normally, and the second control signal is used to control a current module that receives the second control signal to stop operating;

operating normally, by the first current module, according to the first control signal, and setting a bias voltage of a gate of a first MOS transistor and a bias voltage of a gate of a second MOS transistor in the first current module respectively to a first bias voltage VBP1 and a second bias voltage VBN1, where a source of the first MOS transistor is connected to a first analog power supply VADD, a source of the second MOS transistor is grounded, a drain of the first MOS transistor and a drain of the second MOS transistor are coupled, and the first bias voltage VBP1 and the second bias voltage VBN1 are generated by a first bias circuit;

stopping, by the second current module, operating according to the second control signal, and switching a bias voltage of a gate of a third MOS transistor in the second current module from the first bias voltage VBP1 to a third bias voltage VBP2 and switching a bias voltage of a gate of a fourth MOS transistor in the second current module from the second bias voltage VBN1 to a fourth bias voltage VBN2, where a source of the third MOS transistor is connected to a second analog power supply VADD, a source of the fourth MOS transistor is grounded, a drain of the third MOS transistor and a drain of the fourth MOS transistor are coupled, and the third bias voltage VBP2 and the fourth bias voltage VBN2 are generated by a second bias circuit;

detecting, by the signal amplitude detector at a second time T2 after the first time T1, that a signal amplitude of the digital signal is a high signal amplitude;

generating, by the signal controller according to the high signal amplitude, the first control signal provided to the second current module; and resuming, by the second current module, normal operation according to the first control signal, and switching, after operating normally, the bias voltage of the gate of the third MOS transistor from the third bias voltage VBP2 to the first bias voltage VBP1 and switching the bias voltage of the gate of the fourth MOS transistor from the fourth bias voltage VBN2 to the second bias voltage VBN1.

With reference to the second aspect, in a first implementation of the second aspect, a voltage value of the first bias voltage VBP1 is the same as that of the third bias voltage VBP2, and a voltage value of the second bias voltage VBN1 is the same as that of the fourth bias voltage VBN2.

It should be noted that in the embodiments of the present invention, a structure of the first current module is the same as a structure of the second current module.

BRIEF DESCRIPTION OF DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following describes the embodiments of the present invention with reference to the accompanying drawings.

Figure 1:
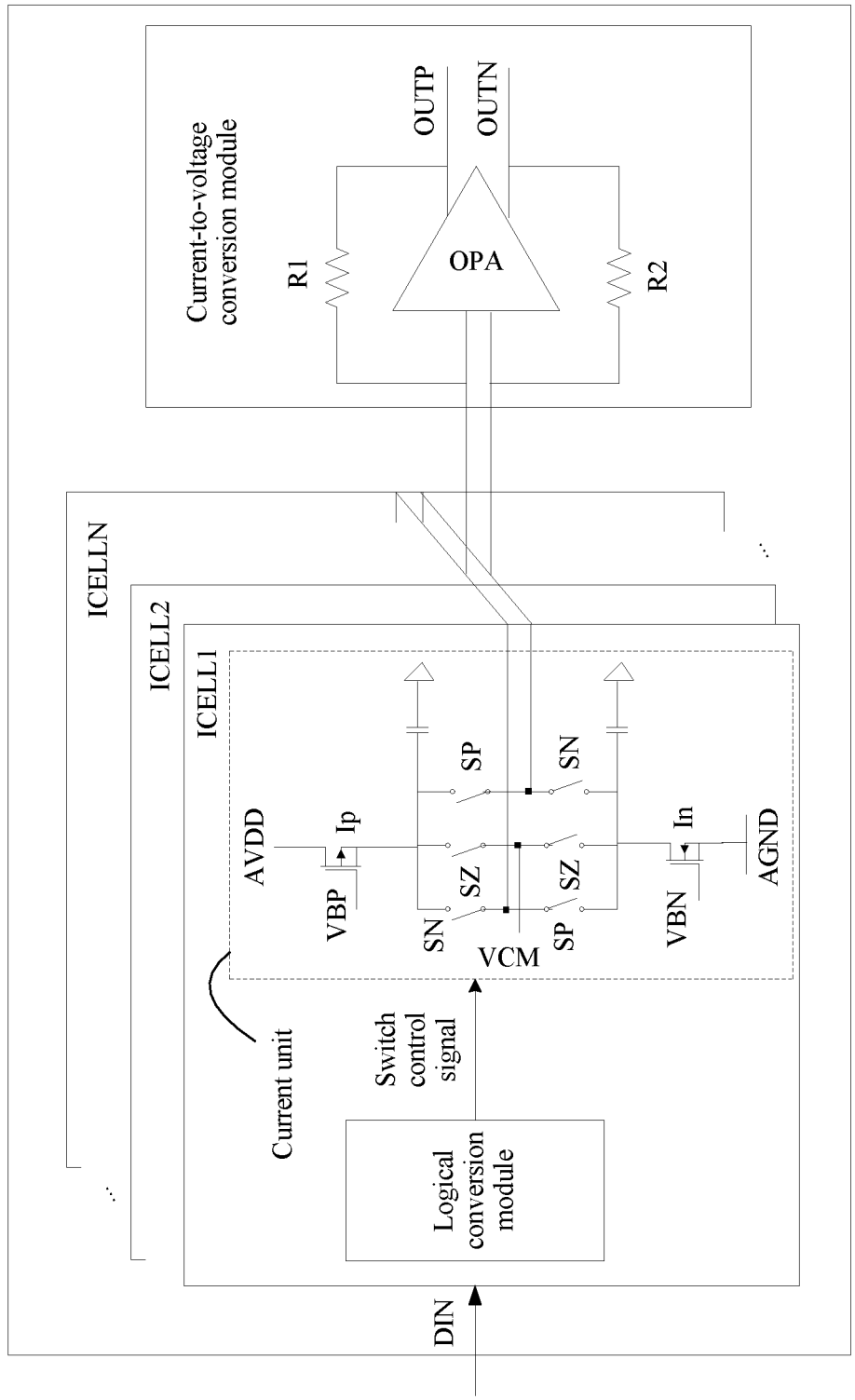
FIG. 1 is a schematic structural diagram of a digital-to-analog converter DAC according to the prior art.
Figure 2:
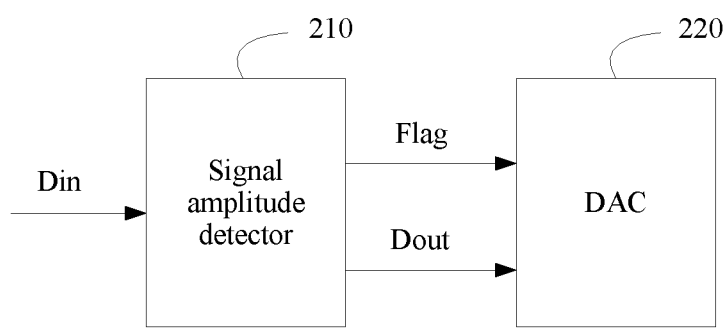
FIG. 2 is a schematic structural diagram of a digital-to-analog conversion circuit according to an embodiment of the present invention.

FIG. 2 shows a digital-to-analog conversion circuit 200 provided by an embodiment of the present invention. The digital-to-analog conversion circuit includes a signal amplitude detector 210 and a digital-to-analog converter 220.

The signal amplitude detector 210 is configured to detect a value of a signal amplitude of an input digital signal Din, and send a detection result as signal amplitude indication information—Flag—to the digital-to-analog converter 220. The detection result is a low signal amplitude or a high signal amplitude, and the signal amplitude indication information—Flag—is first indication information indicating the low signal amplitude or second indication information indicating the high signal amplitude.

It should be noted that the digital signal Din in the present invention may be a digital signal stream, that is, is not limited to a fixed digital signal at a time point.

The signal amplitude detector 210 is further configured to output a delayed digital signal Dout.

The digital-to-analog converter 220 is configured to determine operating statuses of multiple current modules in the digital-to-analog converter 220 according to the received signal amplitude indication information. When the signal amplitude indication information is the second indication information, all of the multiple current modules can operate normally. When the signal amplitude indication information is the first indication information, some of the multiple current modules operate normally while the other current modules stop operating.

It should be noted that for ease of description, in the following embodiments, two current modules are used as an example to describe the multiple current modules in the digital-to-analog converter 220. When the signal amplitude indication information is the second indication information, the two current modules both operate normally. When the signal amplitude indication information is the first indication information, one of the two current modules operates normally while the other current module stops operating. A quantity of current modules is not limited by the present disclosure.

The digital-to-analog converter 220 is further configured to receive the delayed digital signal Dout, to convert the digital signal into an analog signal.

Figure 3:
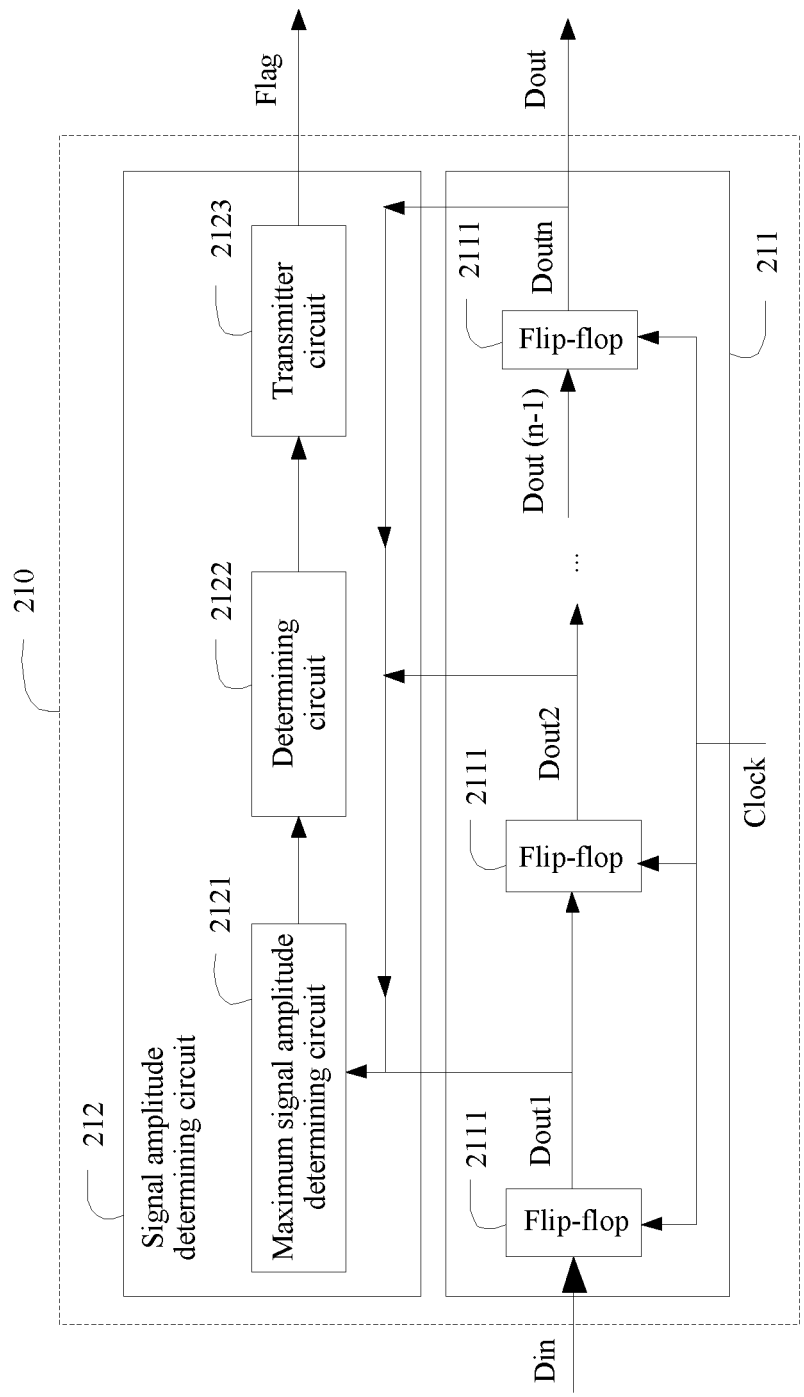
FIG. 3 is a schematic structural diagram of a signal amplitude detector according to an embodiment of the present invention.

FIG. 3 shows a signal amplitude detector 210 provided by an embodiment of the present invention. The signal amplitude detector 210 may be applied to the digital-to-analog conversion circuit 200 in the foregoing embodiment. Specifically, the signal amplitude detector 210 includes:

a delay module 211, configured to: receive a digital signal, delay the digital signal for N clock cycles, provide the digital signal that is delayed for the N clock cycles to a digital-to-analog converter 220, and send the delayed digital signal to a signal amplitude determining circuit 212 after each delay of one clock cycle, where N is a positive integer greater than or equal to 1.

Further, the delay module 211 includes N flip-flops 2111. Each flip-flop delays the received digital signal for one clock cycle, and each flip-flop provides the delayed digital signal to the signal amplitude determining circuit 212, where N is a positive integer greater than or equal to 1.

In some embodiments, each flip-flop may be a D flip-flop.

The signal amplitude determining circuit 212 is configured to: obtain N delayed digital signals from the delay module 211, determine a maximum signal amplitude value in amplitude values of the N delayed digital signals, and determine, by comparing the maximum signal amplitude value with a preset threshold, that a signal amplitude of the digital signal is a high signal amplitude or a low signal amplitude. For example, the signal amplitude of the digital signal is determined as the low signal amplitude at a time T1, and the signal amplitude of the digital signal is determined as the high signal amplitude at a time T2 after the time T1.

Further, the signal amplitude determining circuit 212 includes:

a maximum signal amplitude determining circuit 2121, configured to obtain the N delayed digital signals from the delay module 211, and determine the maximum signal amplitude value in the amplitude values of the N delayed digital signals;

a determining circuit 2122, configured to: compare the maximum signal amplitude value with the preset threshold, and determine that the signal amplitude of the digital signal is the high signal amplitude when the maximum signal amplitude value is greater than the threshold, or determine that the signal amplitude of the digital signal is the low signal amplitude when the maximum signal amplitude value is not greater than the threshold; and a transmitter circuit 2123, configured to send first indication information and second indication information to the digital-to-analog converter 220 after the determining circuit 2122 determines the high signal amplitude or the low signal amplitude.

Optionally, to prevent the low signal amplitude from being immediately sent to the digital-to-analog converter 220 as signal amplitude indication information after being determined, the transmitter circuit 2123 may send the first indication information to the digital-to-analog converter 220 after the determining circuit 2122 determines the high signal amplitude, and send the second indication information to the digital-to-analog converter 220 after a delay of a preset time period after the determining circuit 2122 determines the low signal amplitude. The delayed time period T may be preset according to an application scenario of the digital-to-analog conversion circuit in the present invention, for example, may be set to T>50 ms in an audio application.

Figure 4:
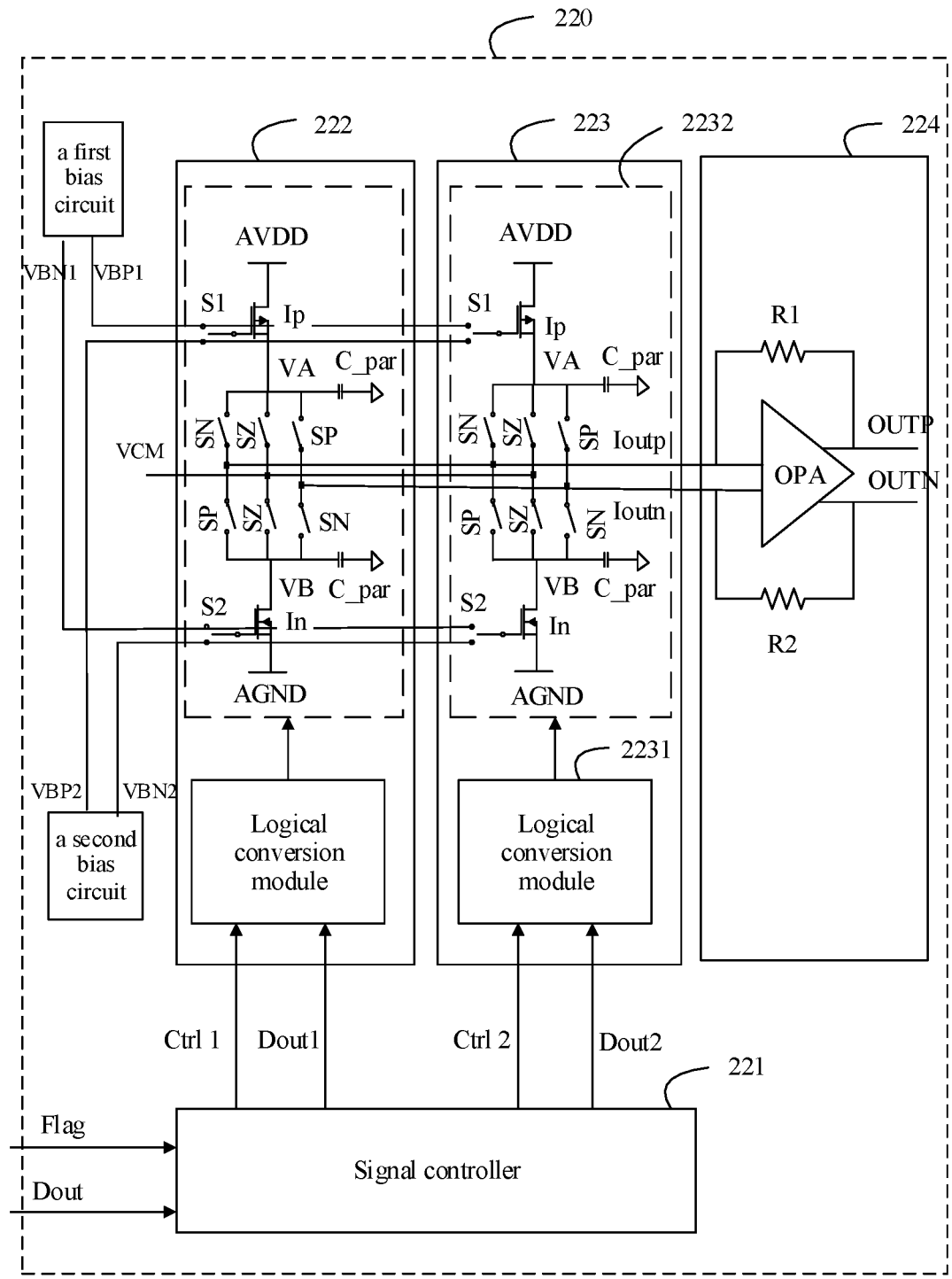
FIG. 4 is a schematic structural diagram of a digital-to-analog converter according to an embodiment of the present invention.

FIG. 4 shows a digital-to-analog converter 220 provided by an embodiment of the present invention. The digital-to-analog converter 220 may be applied to the digital-to-analog conversion circuit 200 in the foregoing embodiment. Specifically, the digital-to-analog converter 220 includes a signal controller 221, a first current module 222, and a second current module 223.

The signal controller 221 is configured to receive first indication information sent by a signal amplitude detector 210, and generate, according to the first indication information, a first control signal ctrl1 provided to the first current module 222 and generate a second control signal ctrl2 provided to the second current module 223. The first control signal ctrl1 is used to control a corresponding current module to operate normally, and the second control signal ctrl2 is used to control a corresponding current module to stop operating. For example, the first control signal ctrl1 controls the first current module 222 to operate normally, and the second control signal ctrl2 controls the second current module 223 to stop operating.

That a current module operates normally means that a current in the current module is in a stable state. When the current is increasing or decreasing, the current module cannot operate normally. When operating normally, the current module consumes power. For example, in the second current module 223 in FIG. 4, the second current module includes a third MOS transistor, a fourth MOS transistor, and three parallel switch branch circuits. A drain of the third MOS transistor and a drain of the fourth MOS transistor are coupled by using the three parallel switch branch circuits. The three parallel switch branch circuits include a first switch branch circuit formed by a first SN signal switch and a first SP signal switch connected in series, a second switch branch circuit formed by a second SN signal switch and a second SP signal switch connected in series, and a third switch branch circuit including the two SZ signal switches connected in series. When establishment of a voltage at a first node VA between the drain of the third MOS transistor and the three parallel switch branch circuits and a voltage at a second node VB between the drain of the fourth MOS transistor and the three parallel switch branch circuits is completed, a current in the second current module is stable, and the second current module is in a normal-operation state. Before establishment of a voltage between the VA and the VB is completed, the current in the second current module is in a changing state.

That a current module stops operating means that all signal switches in the current module are opened. As a result, no current exists in the current module, and no power consumption is caused. For example, in the second current module 223 in FIG. 4, all switches (including two SP signal switches, two SZ signal switches, and two SN signal switches) on the three switch branch circuits are in an open state. In this case, no path exists between the drains of the two MOS transistors in the second current module 223, and there is no current in the second current module 223.

In addition, the signal controller 221 in the digital-to-analog converter 220 receives a delayed digital signal Dout, and decomposes the digital signal Dout into multiple digital signals for provision to multiple current modules in the digital-to-analog converter 220, so that each current module separately processes a digital signal obtained by means of decomposition. For example, in this embodiment, the signal controller 221 decomposes the received digital signal Dout into two digital signals Dout1 and Dout2, provides the Dout1 to the first current module 222, and provides the Dout2 to the second current module 223. The first current module processes the Dout1, and the second current module processes the Dout2.

The first current module 222 is configured to operate normally according to the first control signal ctrl1, and set a bias voltage of a gate of a first MOS transistor and a bias voltage of a gate of a second MOS transistor in the first current module 222 respectively to a first bias voltage VBP1 and a second bias voltage VBN1. A source of the first MOS transistor is connected to a first analog power supply VADD, and the first analog power supply VADD is configured to provide a source voltage to the first current module 222. A source of the second MOS transistor is grounded, that is, is connected to a power supply ANGD. A drain of the first MOS transistor and a drain of the second MOS transistor are coupled, and the first bias voltage VBP1 and the second bias voltage VBN1 are generated by a first bias circuit.

The second current module 223 is configured to stop operating according to the second control signal ctrl2, and switch a bias voltage of a gate of the third MOS transistor in the second current module 223 from the first bias voltage VBP1 to a third bias voltage VBP2 and switch a bias voltage of a gate of the fourth MOS transistor in the second current module 223 from the second bias voltage VBN1 to a fourth bias voltage VBN2. A source of the second MOS transistor is connected to a second analog power supply VADD, and the second analog power supply VADD is configured to provide a source voltage to the second current module 223. A source of the fourth MOS transistor is grounded, that is, is connected to a power supply ANGD. The drain of the third MOS transistor and the drain of the fourth MOS transistor are coupled, and the third bias voltage VBP2 and the fourth bias voltage VBN2 are generated by a second bias circuit.

It should be noted that the first bias circuit and the second bias circuit are two different bias circuits and are both configured to generate a bias voltage. Specific structures of the first bias circuit and the second bias circuit are not limited in the present invention.

Further, a voltage value of the first bias voltage VBP1 equals to that of the third bias voltage VBP2, and a voltage value of the second bias voltage VBN1 equals to that of the fourth bias voltage VBN2.

It can be learned from the above that before the second current module 223 switches the bias voltage of the gate of the third MOS transistor from the first bias voltage VBP1 to the third bias voltage VBP2 and switches the bias voltage of the gate of the fourth MOS transistor in the second current module 223 from the second bias voltage VBN1 to the fourth bias voltage VBN2, the bias voltage of the gate of the third MOS transistor and the bias voltage of the gate of the fourth MOS transistor are respectively the first bias voltage VBP1 and the second bias voltage VBN1 that are generated by the first bias circuit. That is, when signal amplitude indication information is a high signal amplitude, the bias voltage of the gate of the third MOS transistor is set to the first bias voltage VBP1, and the bias voltage of the gate of the fourth MOS transistor is set to the second bias voltage VBN1.

Further, after receiving second indication information sent by the signal amplitude detector 210, the signal controller 221 is further configured to generate, according to the second indication information, the first control signal ctrl1 provided to the second current module 223 (provision of the first control signal ctrl1 to the second current module 223 is not shown in FIG. 4).

Correspondingly, the second current module 223 is configured to resume normal operation according to the received first control signal ctrl1, and switch, after operating normally, the bias voltage of the gate of the third MOS transistor from the third bias voltage VBP2 to the first bias voltage VBP1 and switch the bias voltage of the gate of the fourth MOS transistor from the fourth bias voltage VBN2 to the second bias voltage VBN1.

It should be noted that after receiving the second indication information, in addition to providing the first control signal ctrl1 to the second current module, the signal controller 221 further sends the generated first control signal ctrl1 to the first current module 222. Correspondingly, the first current module 222 is configured to continue to operate normally according to the first control signal ctrl1, and maintain the bias voltage of the gate of the first MOS transistor in the first current module and the bias voltage of the gate of the second MOS transistor in the first current module to be respectively the first bias voltage VBP1 and the second bias voltage VBN1, that is, the first current module 222 keeps operating and the bias voltages remain unchanged.

Further, the second current module 223 includes a logical conversion unit 2231 and a current unit 2232. The current unit 2232 includes the third MOS transistor, the fourth MOS transistor, and the three parallel switch branch circuits. The drain of the third MOS transistor and the drain of the fourth MOS transistor are coupled by using the three parallel switch branch circuits. The three parallel switch branch circuits include the first switch branch circuit formed by the first SN signal switch and the first SP signal switch connected in series, the second switch branch circuit formed by the second SN signal switch and the second SP signal switch connected in series, and the third switch branch circuit including the two SZ signal switches connected in series.

The logical conversion unit 2231 is configured to receive the first control signal ctrl1, and generate, based on the first control signal ctrl1, a switch control signal provided to the current unit 2232. The switch control signal is used to control the two SZ signal switches connected in series in the third switch branch circuit in the current unit 2232 to be in a closed state and the signal switches in the other two switch branch circuits to be in the open state.

Correspondingly, the current unit 2232 is configured to:

control, according to the switch control signal received from the logical conversion unit 2231, the two SZ signal switches connected in series in the third switch branch circuit in the current unit 2232 to be in the closed state and the signal switches in the other two switch branch circuits to be in the open state, and switch, after the current unit 2232 resumes normal operation, the bias voltage of the gate of the third MOS transistor from the third bias voltage VBP2 to the first bias voltage VBP1 and switch the bias voltage of the gate of the fourth MOS transistor from the fourth bias voltage VBN2 to the second bias voltage VBN1.

Further, a specific structure of the current unit 2232 is as follows:

The gate of the third MOS transistor is coupled to the first bias voltage or the third bias voltage by using a first voltage switch, and the gate of the fourth MOS transistor is coupled to the second bias voltage or the fourth bias voltage by using a second voltage switch.

It should be noted that two types of switches exist in the current unit 2232. One type is a signal switch. The signal switch is mainly configured to control a switch in a branch circuit in the current unit, so as to control the current unit to operate normally or stop operating. For example, the signal switch is an SN switch, an SZ switch, or an SP switch. The other type of switch is a voltage switch. The voltage switch is mainly configured to control the bias voltages of the gates of the two MOS transistors in the current unit. For example, in FIG. 4, a voltage switch 51 is configured to select a bias voltage from the first bias voltage VBP1 and the third bias voltage VBP2, and a voltage switch S2 is configured to select a bias voltage from the second bias voltage VBN1 and the fourth bias voltage VBN2.

The first node VA between the drain of the third MOS transistor and the three parallel switch branch circuits is connected to a first parasitic capacitor C_par, and the second node VB between the drain of the fourth MOS transistor and the three parallel switch branch circuits is connected to a second parasitic capacitor C_par.

In addition, a reference bias voltage VCM is coupled between the two SZ signal switches connected in series in the third switch branch circuit.

For the foregoing specific structure of the current unit 2232, the current unit 2232 is further configured to:

control, according to the switch control signal, the two SZ signal switches connected in series in the third switch branch circuit in the current unit 2232 to be closed and a signal switch in another branch circuit to be opened, switch, after establishment of a voltage between the first node VA and the second node VB is completed, the bias voltage of the gate of the third MOS transistor from the third bias voltage VBP2 to the first bias voltage VBP1 by using the first voltage switch 51, and switch the bias voltage of the gate of the fourth MOS transistor from the fourth bias voltage VBN2 to the second bias voltage VBN1 by using the second voltage switch S2.

It should be noted that structures of the first current module 222 and the second current module 223 are the same. The first current module 222 may also include a logical conversion unit and a current unit, and the first current module may also execute a same function as the second current module 223 does. For ease of description, a detailed structure and a specific function of the first current module 222 are not further described in this embodiment.

Further, the digital-to-analog converter 220 further includes a current-to-voltage conversion module 224, configured to convert an analog current signal that is output by each current module (including the first current module 222 and the second current module 223) into an analog voltage signal.

The first switch branch circuit and the third switch branch circuit that are in the second current module 223 are separately connected to the current-to-voltage conversion module 224. Specifically, a first current Ioutp is output between the first SN signal switch and the first SP signal switch in the first switch branch circuit to the current-to-voltage conversion module 224, and a second current Ioutn is output between the second SN signal switch and the second SP signal switch in the second switch branch circuit to the current-to-voltage conversion module 224.

Similar to the second current module 223, the first current module 222 also outputs currents Ioutp and Ioutn to the current-to-voltage conversion module 224.

Because a structure of the current-to-voltage conversion module 224 is the same as a structure of a current-to-voltage conversion module in the prior art, the structure of the current-to-voltage conversion module 224 is not further described in this embodiment.

It should be noted that in this embodiment, two current modules are provided as an example. Actually, the digital-to-analog converter 220 may include at least two current modules. A quantity of current modules in the digital-to-analog converter 220 is not limited in the present invention.

In this embodiment, when the signal amplitude detector detects a low signal amplitude, the first current module operates normally and the second current module stops operating, and therefore power consumption of the digital-to-analog converter is reduced at the low signal amplitude. In addition, when stopping operating, the second current module is in a state of the third bias voltage and the fourth bias voltage that are generated by the second bias circuit, and when operating normally, the first current module is in a state of the first bias voltage and the second bias voltage that are generated by the first bias circuit. When the amplitude detector detects the high signal amplitude subsequently, the second current module needs to resume normal operation. At this time, the second current module is still in the state of the third bias voltage and the fourth bias voltage that are generated by the second bias circuit, and the first current module is in the state of the first bias voltage and the second bias voltage that are generated by the first bias circuit. Therefore, before the second current module resumes the normal operation, a jitter generated in the second current module does not affect the first current module. After the second current module operates normally, the second current module switches back to the first bias voltage and the second bias voltage that are generated by the first bias circuit. This further reduces a nonlinearity problem caused in a process in which the second current module resumes the normal operation.

Figure 5A:
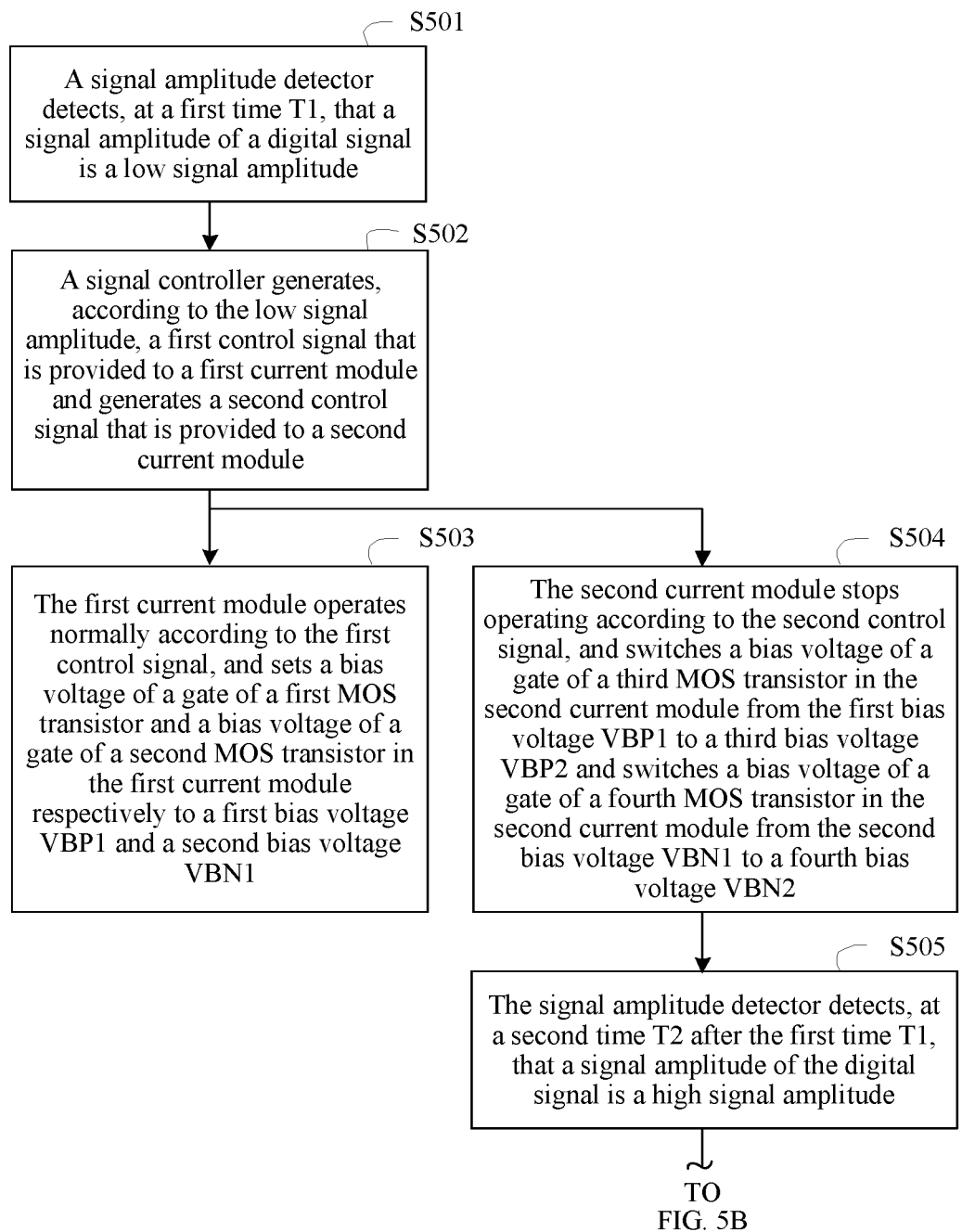
FIG. 5A and FIG. 5B are a flowchart of a method for controlling a bias voltage in a current module according to an embodiment of the present invention.
Figure 5B:
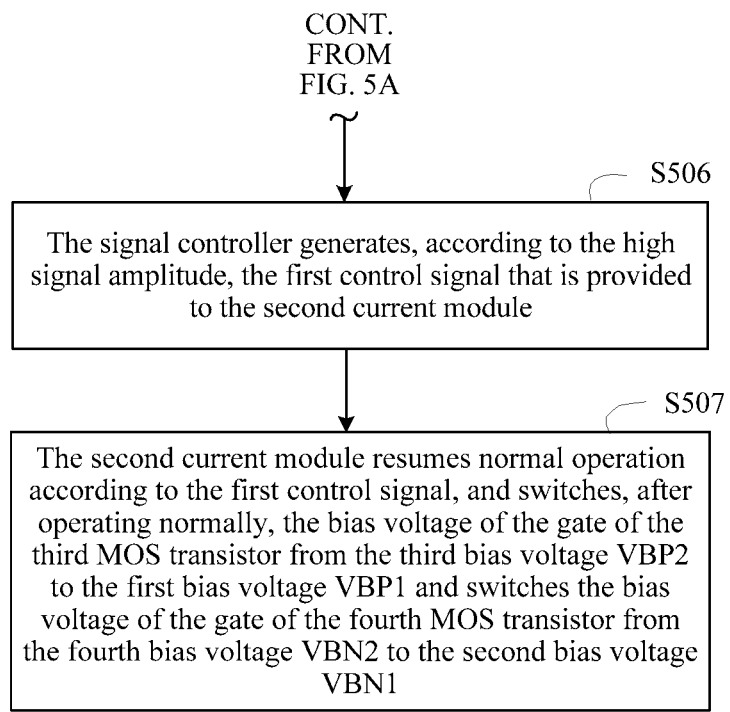

FIG. 5A and FIG. 5B show a method for controlling a bias voltage in a current module in a digital-to-analog conversion circuit provided by an embodiment of the present invention. The digital-to-analog conversion circuit may be the digital-to-analog conversion circuit disclosed in the foregoing embodiment. Therefore, in this embodiment, for a structure of the digital-to-analog conversion circuit, refer to the structure of the digital-to-analog conversion circuit disclosed in the foregoing embodiment, and details are not described herein again.

Specifically, the method for controlling a bias voltage in a current module in a digital-to-analog conversion circuit includes the following steps.

S501. A signal amplitude detector detects, at a first time T1, that a signal amplitude of a digital signal is a low signal amplitude.

S502. A signal controller generates, according to the low signal amplitude, a first control signal provided to a first current module and generates a second control signal provided to a second current module.

The first control signal is used to control a current module that receives the first control signal to operate normally, and the second control signal is used to control a current module that receives the second control signal to stop operating.

S503. The first current module operates normally according to the first control signal, and sets a bias voltage of a gate of a first MOS transistor and a bias voltage of a gate of a second MOS transistor in the first current module respectively to a first bias voltage VBP1 and a second bias voltage VBN1.

A source of the first MOS transistor is connected to a first analog power supply VADD, a source of the second MOS transistor is grounded, a drain of the first MOS transistor and a drain of the second MOS transistor are coupled, and the first bias voltage VBP1 and the second bias voltage VBN1 are generated by a first bias circuit.

S504. The second current module stops operating according to the second control signal, and switches a bias voltage of a gate of a third MOS transistor in the second current module from the first bias voltage VBP1 to a third bias voltage VBP2 and switches a bias voltage of a gate of a fourth MOS transistor in the second current module from the second bias voltage VBN1 to a fourth bias voltage VBN2.

A source of the second MOS transistor is connected to a second analog power supply VADD, a source of the fourth MOS transistor is grounded, a drain of the third MOS transistor and a drain of the fourth MOS transistor are coupled, and the third bias voltage VBP2 and the fourth bias voltage VBN2 are generated by a second bias circuit.

S505. The signal amplitude detector detects, at a second time T2 after the first time T1, that a signal amplitude of the digital signal is a high signal amplitude.

S506. The signal controller generates, according to the high signal amplitude, the first control signal provided to the second current module.

S507. The second current module resumes normal operation according to the first control signal, and switches, after operating normally, the bias voltage of the gate of the third MOS transistor from the third bias voltage VBP2 to the first bias voltage VBP1 and switches the bias voltage of the gate of the fourth MOS transistor from the fourth bias voltage VBN2 to the second bias voltage VBN1.

Further, a voltage value of the first bias voltage VBP1 is the same as that of the third bias voltage VBP2, and a voltage value of the second bias voltage VBN1 is the same as that of the fourth bias voltage VBN2.

In this embodiment, when the signal amplitude detector detects a low signal amplitude, the first current module operates normally and the second current module stops operating, and therefore power consumption of the digital-to-analog converter is reduced at the low signal amplitude. In addition, when stopping operating, the second current module is in a state of the third bias voltage and the fourth bias voltage that are generated by the second bias circuit, and when operating normally, the first current module is in a state of the first bias voltage and the second bias voltage that are generated by the first bias circuit. When the amplitude detector detects the high signal amplitude subsequently, the second current module needs to resume normal operation. At this time, the second current module is still in the state of the third bias voltage and the fourth bias voltage that are generated by the second bias circuit, and the first current module is in the state of the first bias voltage and the second bias voltage that are generated by the first bias circuit. Therefore, before the second current module resumes the normal operation, a jitter generated in the second current module does not affect the first current module. After the second current module operates normally, a second current module switches back to the first bias voltage and the second bias voltage that are generated by the first bias circuit. This further reduces a nonlinearity problem caused in a process in which the second current module resumes normal operation.

In the several embodiments provided in this disclosure, it should be understood that the disclosed apparatus and method may be implemented in other manners. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

The invention claimed is:

1. A digital-to-analog conversion circuit, comprising:
a first current module and a second current module,
wherein bias voltages of the first current module are a first bias voltage VBP1 and a second bias voltage VBN1, and the first bias voltage VBP1 and the second bias voltage VBN1 are generated by a first bias circuit;
wherein one bias voltage of the second current module is switched between the first bias voltage VBP1 and a third bias voltage VBP2, the other bias voltage of the second current module is switched from the second bias voltage VBN1 and a fourth bias voltage VBN2, and the third bias voltage VBP2 and the fourth bias voltage VBN2 are generated by a second bias circuit.

2. The digital-to-analog conversion circuit according to claim 1, wherein the second current module comprises a third MOS transistor and a first voltage switch, and the first voltage switch, coupled to the gate of the third MOS transistor, is configured to select a bias voltage between the first bias voltage VBP1 and the third bias voltage VBP2.

3. The digital-to-analog conversion circuit according to claim 2, wherein the second current module comprises a fourth MOS transistor and a second voltage switch, and the second voltage switch, coupled to the gate of the fourth MOS transistor, is configured to select a bias voltage between the second bias voltage VBN1 and the fourth bias voltage VBN2.

4. The digital-to-analog conversion circuit according to claim 2, wherein the second current module comprises three parallel switch branch circuits, the drain of the third MOS transistor and the drain of the fourth MOS transistor are coupled by using the three parallel switch branch circuits, the three parallel switch branch circuits comprise a first switch branch circuit formed by a first SN signal switch and a first SP signal switch connected in series, a second switch branch circuit formed by a second SN signal switch and a second SP signal switch connected in series, and a third switch branch circuit comprising two SZ signal switches connected in series.

5. The digital-to-analog conversion circuit according to claim 4, wherein a first node between the drain of the third MOS transistor and the three parallel switch branch circuits is connected to a first parasitic capacitor, and a second node between the drain of the fourth MOS transistor and the three parallel switch branch circuits is connected to a second parasitic capacitor.

6. The digital-to-analog conversion circuit according to claim 1, wherein
a voltage value of the first bias voltage VBP1 is the same as that of the third bias voltage VBP2, and a voltage value of the second bias voltage VBN1 is the same as that of the fourth bias voltage VBN2.

7. The digital-to-analog conversion circuit according to claim 1, wherein the first current module comprises a first MOS transistor and a third voltage switch, and the third voltage switch, coupled to the gate of the first MOS transistor, is configured to select a bias voltage between the first bias voltage VBP1 and the third bias voltage VBP2.

8. The digital-to-analog conversion circuit according to claim 7, wherein the first current module comprises a second MOS transistor and a fourth voltage switch, and the fourth voltage switch, coupled to the gate of the second MOS transistor, is configured to select a bias voltage between the second bias voltage VBN1 and the fourth bias voltage VBN2.

9. The digital-to-analog conversion circuit according to claim 1, wherein the digital-to-analog conversion circuit comprises:
a signal amplitude detector, configured to detect a signal amplitude of an input signal and output a detected result;
wherein the one bias voltage of the second current module is switched between the first bias voltage VBP1 and the third bias voltage VBP2 according to the detected result, and the other bias voltage of the second current module is switched from the second bias voltage VBN1 and the fourth bias voltage VBN2 according to the detected result.

10. The digital-to-analog conversion circuit according to claim 9, wherein the signal amplitude detector comprises N flip-flops and a signal amplitude determining circuit,
the N flip-flops coupled to the signal amplitude determining circuit, configured to generate N delayed signals based on the input signal, and provide the N delayed signals to the signal amplitude determining circuit;
the signal amplitude determining circuit, configured to determine the detected result according to the received N delayed signals.

* * * * *